United States Patent [19]

Mizuta

[11] Patent Number: 5,734,618
[45] Date of Patent: Mar. 31, 1998

[54] MEMORY CARD WITH LOW POWER CONSUMPTION IN INACTIVE STATE

[75] Inventor: Masaharu Mizuta, Tokyo, Japan

[73] Assignee: Mitsubishi Denki Kabushiki Kaisha, Tokyo, Japan

[21] Appl. No.: 690,318

[22] Filed: Jul. 25, 1996

[30] Foreign Application Priority Data

Feb. 19, 1996 [JP] Japan .................... 8-030844

[51] Int. Cl.[6] .................................................. G11C 5/14
[52] U.S. Cl. .................................. 365/229; 365/227
[58] Field of Search ........................ 365/229, 228, 365/227, 226

[56] References Cited

U.S. PATENT DOCUMENTS

| 4,912,346 | 3/1990 | Mizuta | 365/228 X |
| 5,140,557 | 8/1992 | Yoshida | 365/226 |
| 5,212,664 | 5/1993 | Shinohara | 365/229 |
| 5,245,582 | 9/1993 | Kimura | 365/229 |
| 5,490,118 | 2/1996 | Nishioka | 365/229 |

*Primary Examiner*—David C. Nelms
*Assistant Examiner*—Son Mai

[57] ABSTRACT

A memory card including an integrated memory circuit and internal power supply wherein a power supply voltage to the memory circuit is supplied from the internal power supply when the memory card is not mounted in a data processing device and from the data processing device when the memory card is mounted therein and further includes an operating signal detection circuit for determining whether the memory card is active or inactive in a mounted state and a power supply control circuit for dropping the power supply voltage applied to the memory circuit by a predetermined amount when the memory card is inactive.

9 Claims, 4 Drawing Sheets

|  | set state | | not set state |
|---|---|---|---|
| mode | active | inactive | hold |
| applied voltage | 5V | 3.3V | 3V |
| current consumption | 100mA | 1 μA< | 1 μA< |

|  | set state | | not set state |
|---|---|---|---|
| mode | active | inactive | hold |
| applied voltage | 5V | 5V | 3V |
| current consumption | 100mA | 20 μA | 1 μA< |

… # 1

MEMORY CARD WITH LOW POWER CONSUMPTION IN INACTIVE STATE

BACKGROUND OF THE INVENTION

1. Field of the Invention

The present invention relates to a personal computer memory card conforming to the PCMCIA standard, and relates particularly to a low power consumption type static RAM (SRAM) memory card.

2. Description of the Prior Art

FIG. 7 shows the configuration of a prior art SRAM memory card 51 including, as shown in the FIG. 7, an SRAM integrated circuit 52, and an internal power supply circuit 55. The internal power supply circuit 55 includes a diode 53 and battery 54. Power supply Vcc supplying a power supply voltage (normally 5 V) from an external source, and ground GND providing a reference potential, are connected to both the SRAM integrated circuit 52 and the internal power supply circuit 55. The SRAM integrated circuit 52 is also connected to data access control line 56 via which the address, data, read/write, card enable, and other signals are communicated.

The diode 53 prevents contact between the external power supply and the battery 54. The battery 54 is used to supply the voltage required to maintain the data stored to the SRAM integrated circuit 52 when the SRAM memory card 51 is not mounted in a data processing device (specifically, a personal computer (PC) in this example) and power is therefore not supplied from an external power supply.

The current consumption of each SRAM integrated circuit 52 contained in the SRAM memory card 51 during each possible operating mode is shown in FIG. 8. As shown in FIG. 8, there are three possible operating modes: the active mode, during which the SRAM integrated circuit 52 is accessed while mounted in a PC; the inactive mode, during which the SRAM integrated circuit 52 is not accessed while mounted in a PC; and the hold mode, which simply holds the data stored to the SRAM integrated circuit 52 when the SRAM memory card 51 is not mounted in a PC. Note that the voltage supply to the SRAM integrated circuit 52 in the inactive mode (when mounted in a PC) is high relative to the power supply in the hold mode (when not mounted in a PC), and current consumption is therefore also high.

During the inactive mode, however, the SRAM integrated circuit 52 is not accessed. It is therefore only necessary to supply the SRAM integrated circuit 52 with the voltage required to hold the data, i.e., a voltage equivalent to that supplied in the hold mode. This makes it possible to greatly reduce current consumption in the inactive mode by supplying to the SRAM integrated circuit 52 the same low voltage supplied in the hold mode. As a result, a low power consumption SRAM memory card can be achieved.

SUMMARY OF THE INVENTION

Therefore, the object of the present invention is to provide a low power consumption memory card by reducing the voltage supplied in the inactive mode.

To achieve this object, a memory card according to the present invention comprises an integrated memory circuit and internal power supply whereby power is supplied from a data processing device when the memory card is mounted in said data processing device, and power is supplied from the internal power supply when the memory card is not mounted, and includes an operating signal detection circuit for determining whether the memory card is active or inactive when mounted in the data processing device based on an operating control signal input thereto from the data processing device, and a power supply control circuit for controlling the power supply voltage applied to the integrated memory circuit such that the power supply voltage from the data processing device is applied to the integrated memory circuit when the memory card is active, and the power supply voltage from the data processing device is dropped to a known amount before being applied to the integrated memory circuit when the memory card is inactive.

In a memory card thus comprised, the operating signal detection circuit detects the memory card state, active or inactive, based on the operating control signal from the data processing device. Based on the detection result output by the operating signal detection circuit, the power supply control circuit applies the power supply voltage from the data processing device to the SRAM integrated circuit when the memory card is active; when the memory card is inactive, the power supply control circuit drops the power supply voltage a known amount to supply the SRAM integrated circuit with only enough voltage to hold the data.

In the preferred embodiment of a memory card according to the present invention, the operating signal detection circuit is a retriggerable single-shot multivibrator of which the input trigger is the operating control signal from the data processing device.

The data processing device outputs the operating control signal to the memory card in order to access the memory card. Because the single-shot multivibrator of the operating signal detection circuit uses the operating control signal from the data processing device as the trigger, the control signal is output for a known period (the single-shot period) after the operating control signal is input. Because the single-shot multivibrator has a retrigger function, the control signal is output continuously while the operating control signal is continuously input during the single-shot period. The operating state of the memory card can thus be determined based on the control signal from the operating signal detection circuit.

In the preferred embodiment of a memory card according to the present invention, the power supply control circuit comprises a DC-DC converter and a standby signal output circuit. The DC-DC converter applies the power supply voltage from the data processing device to the integrated memory circuit when the memory card is active; when the memory card is inactive, the DC-DC converter drops the power supply voltage from the data processing device a known amount, and then applies this low power supply voltage to the integrated memory circuit. The standby signal output circuit outputs a standby signal to temporarily pause data processing device operation when memory card operation changes from the inactive to the active state.

In a power supply control circuit thus comprised, the DC-DC converter operates according to the detection result from the operating signal detection circuit, applying the power supply voltage from the data processing device to the integrated memory circuit when the memory card is active, and dropping the power supply voltage from the data processing device a known amount to apply a low voltage current to the integrated memory circuit when the memory card is inactive.

When the memory card operating state changes from inactive to active, the standby signal output circuit supplies a standby signal to the data processing device to delay the start of data processing device operation for a specific period. The data processing device is therefore able to access the memory card after the voltage supply to the integrated memory circuit stabilizes, and read/write operations can be normally accomplished.

In the preferred embodiment of the memory card of the invention, the integrated memory circuit is an SRAM integrated circuit.

An SRAM integrated circuit requires less power to hold the data contents in the inactive mode than in the active mode, and the voltage applied in the active mode is therefore lower than the voltage applied in the inactive mode.

In a further embodiment of the memory card of the invention, the integrated memory circuit is a flash memory circuit.

A flash memory circuit similarly requires less power to hold the data contents in the inactive mode than in the active mode, and the voltage applied in the active mode is therefore lower than the voltage applied in the inactive mode.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given below and the accompanying diagrams wherein.

DESCRIPTION OF PREFERRED EMBODIMENTS

The preferred embodiments of the present invention are described below with reference to the accompanying figures.

Figure 1:
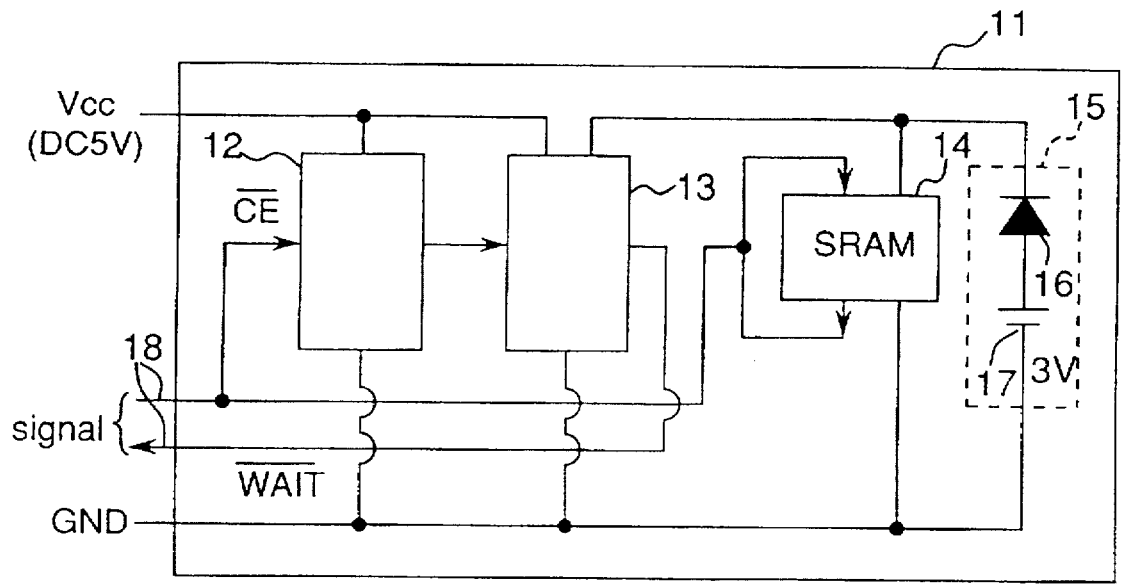
FIG. 1 is circuit diagram of an SRAM type memory card according to the present invention.

FIG. 1 is circuit diagram of an SRAM type memory card according to the present invention. An SRAM memory card 11 (simply "memory card" below) according to the present embodiment includes an operating signal detection circuit 12 for detecting the operating control signal from the data processing device ("PC" below) and outputting a control signal; a power supply control circuit 13 for outputting a specific voltage according to the control signal; an SRAM integrated circuit 14 for storing data; and an internal power supply circuit 15, i.e., a back-up power supply circuit.

The operating signal detection circuit 12 is connected to power supply Vcc supplying a power supply voltage (normally 5 V) from an external source, and to the ground GND providing a reference potential. The power supply control circuit 13 is connected to the power supply Vcc and ground GND, and outputs a predetermined power supply voltage and standby signal delaying the start of PC operation based on the control signal input from the operating signal detection circuit 12.

The SRAM integrated circuit 14 is supplied with power from the power supply control circuit, and is connected to the ground GND and to data access control line 18 for signal communications, including address, data, read/write, card enable (CE), and WAIT signal communications.

The internal power supply circuit 15 includes a diode 16 to prevent collision between the power supply from outside the memory card, and the internal power supply, and a battery 17 for supplying the 3-V current required to hold the stored data. The internal power supply circuit 15 is connected to the SRAM integrated circuit 14 and the ground GND.

Of the signals communicated by the data access control line 18, the card enable CE signal, which is used in this embodiment as the operating control signal, and the WAIT signal, which is used as the standby signal, are described specifically below. Both the card enable CE signal and the WAIT signal are defined by the PCMCIA specification and operate with negative logic. The card enable CE signal is therefore referenced as the /CE signal below, and the WAIT signal as the /WAIT signal.

The /CE signal is the signal setting the memory card to the active state, thereby enabling the PC to read/write data to/from the memory card. More specifically, the memory card 11 is enabled and active when the /CE signal is LOW, and is disabled (inactive) when the /CE signal is HIGH. The /CE signal is used as the operating control signal in the present embodiment, and thus determines the active/inactive status of the memory card.

The /WAIT signal sets the CPU of the data processing device to the wait cycle state. The CPU is therefore in the standby state when the /WAIT signal is LOW, and is active when the /WAIT signal is HIGH. By thus outputting the /WAIT signal as the standby signal, the present embodiment is able to delay the start of PC CPU operation as necessary.

The operating signal detection circuit 12 and the power supply control circuit 13 are described next before describing the overall operation of the memory card shown in FIG. 1.

The operating signal detection circuit 12 in this embodiment is preferably a retriggerable single-shot multivibrator. A single-shot multivibrator outputs a pulse signal of a known pulse width (the "single-shot pulse width" below) when the trigger is input. A retriggerable single-shot multivibrator can be triggered to output multiple times ("retriggered") within the single-shot width. Thus, if the single-shot multivibrator is retriggered while outputting in response to a previous trigger signal, the retriggerable single-shot multivibrator immediately re-outputs the pulse signal of the known single-shot pulse width when the new trigger signal is applied. As a result, the retriggerable single-shot multivibrator can be caused to continuously output a single-shot pulse width output signal by re-applying the trigger signal between the rise and fall of the multivibrator output pulse. Single-shot multivibrators of this type are commonly available in integrated circuits, of which the Texas Instruments SN74233 is typical.

Figure 2A:
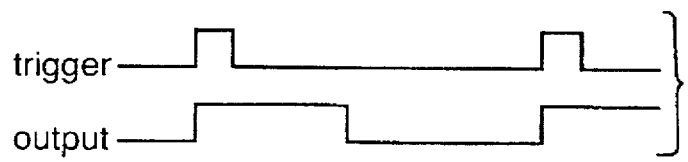
FIGS. 2A and 2B are wave diagrams used to describe the operation of a single-shot multivibrator.
Figure 2B:
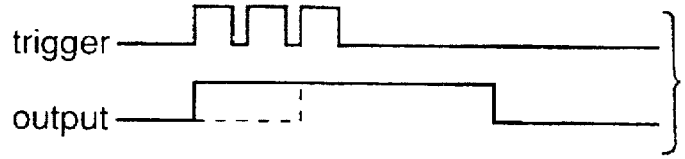

FIGS. 2A and 2B are waveform diagrams used to describe the operation of a common retriggerable single-shot multivibrator. FIG. 2A shows the pulse width of the single-shot output signal generated in response to the trigger signal input, and FIG. 2B shows the output signal of the retrigger function. When the trigger is input repeatedly within one single-shot pulse width, the pulse signal is output again in response to each trigger signal. The net effect is to lengthen the pulse width of the output signal.

Figure 3A:
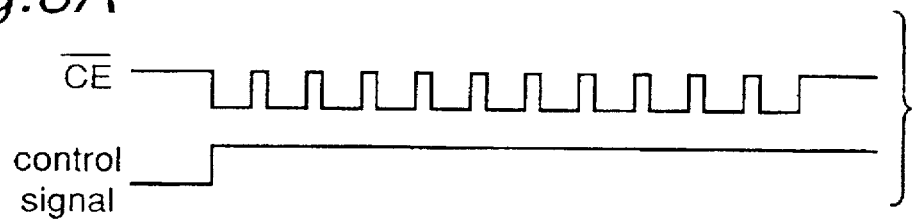
FIGS. 3A, 3B and 3C are wave diagrams used to describe the operation of the operating signal detection circuit according to the present invention.
Figure 3B:
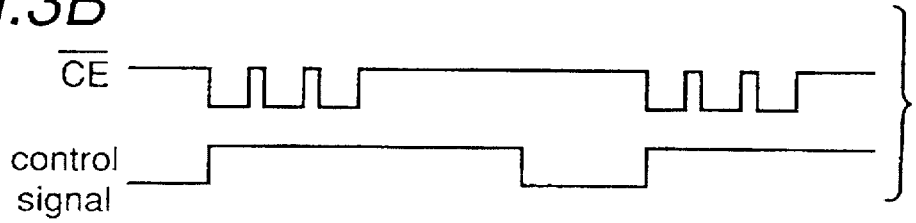
Figure 3C:
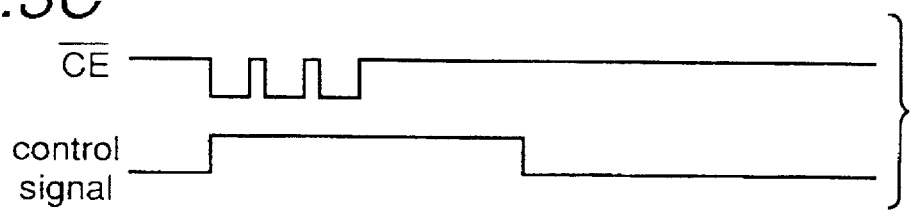

FIGS. 3A–3C are used to describe the operation of the operating signal detection circuit 12 according to the present embodiment. The top signal wave form in each of FIGS. 3A–3C is the /CE signal, and the bottom signal wave form is the output of the operating signal detection circuit 12 (multivibrator). FIG. 3A shows the operation when the memory card 11 is accessed at an interval shorter than the single-shot pulse width of the multivibrator used as the operating signal detection circuit 12. FIG. 3B shows the operation when the memory card 11 is accessed at an interval longer than said single-shot pulse width. FIG. 3C shows the operation when the memory card 11 is accessed and is then inactive.

When the memory card 11 is accessed at an interval shorter than the single-shot pulse width of the multivibrator (FIG. 3A), i.e., when the /CE signal is input at an interval shorter than the single-shot pulse width of the multivibrator, the pulse signal is output repeatedly, resulting in a continuously HIGH signal output. When the memory card 11 is accessed at an interval greater than said single-shot pulse width, i.e., when the /CE signal is input at an interval greater than said single-shot pulse width (FIG. 3B), the pulse signal is not output repeatedly within the single-shot pulse width, and LOW signal periods are therefore present in the multivibrator output. When the memory card 11 is accessed but not re-accessed, the multivibrator output drops at the end of the single-shot pulse width and stays LOW. The operating signal detection circuit 12 thus outputs a HIGH signal for the single-shot pulse width after the /CE signal is input, and outputs a LOW signal if the /CE signal is not input again during or after the single-shot pulse width.

As a result, the memory card is known to be active when the output signal from the operating signal detection circuit 12 is HIGH, and inactive when the output signal is LOW.

The power supply control circuit 13 is described next.

The power supply control circuit 13 of the present embodiment converting the voltage supplied from the PC to a known DC voltage according to the control signal from the operating signal detection circuit 12, and outputs a standby signal delaying the timing of PC operation when the memory card 11 is changed from an inactive to an active state.

Figure 4:
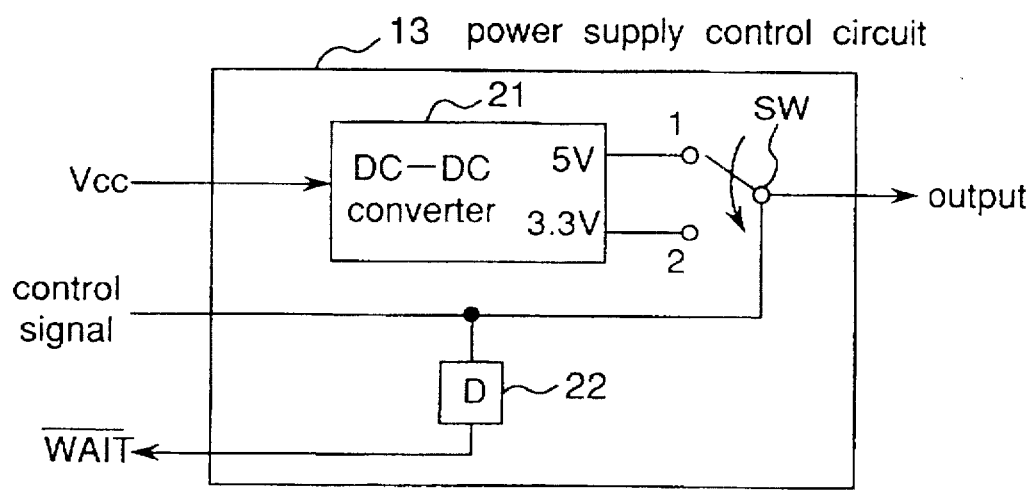
FIG. 4 is a circuit diagram of the power supply control circuit according to the present invention.

As shown in FIG. 4, the power supply control circuit 13 includes a DC-DC converter 21 for converting the input voltage to a predetermined voltage; a switch SW for switching the output from the DC-DC converter 21 according to the control signal from the operating signal detection circuit 12; and a delay circuit 22 for delaying the control signal a known period and then outputting the delayed control signal.

The DC-DC converter 21 converts the power supply Vcc from the PC to known voltages. Two voltages are used in this example with one, 5 V, output from output 1, and the other, 3.3 V, output from the other output 2. Controlled by the control signal from the operating signal detection circuit 12, the switch SW selects output 1 (5 V) when the memory card 11 is active (the control signal is HIGH), and selects output 2 (3.3 V) when the memory card 11 is inactive (the control signal is LOW). The output voltage of the DC-DC converter 21 is thus switched according to the control signal from the operating signal detection circuit 12.

The delay circuit 22 outputs to the PC a wait signal delaying the control signal from the operating signal detection circuit 12. This wait signal is output as the /WAIT signal, which introduces a wait cycle to the memory access cycle of the PC when the memory card changes from an inactive to an active state, thereby delaying PC activity until the voltage applied to the memory card can rise from 3.3 V and stabilize at 5 V. The PC can therefore maintain reliable memory access after voltage stabilization.

Figures 5, 6:
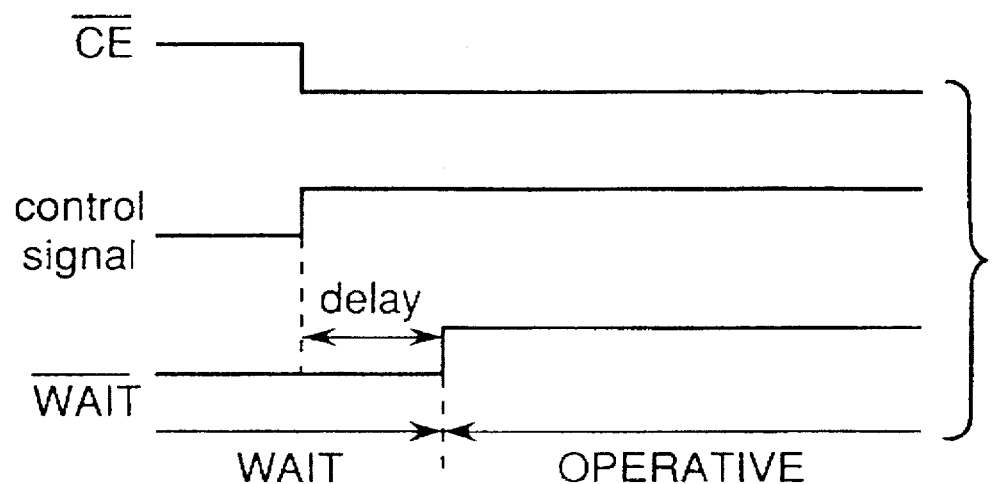
FIG. 5 is a wave diagram used to describe the relationship between the control signal of the operating signal detection circuit and the WAIT signal.
FIG. 6 is a table showing the current consumption of an SRAM memory card according to the present invention during various operating states.

The relationship between the /CE signal, the control signal from the operating signal detection circuit 12, and the /WAIT signal, is shown in FIG. 5. When an operating control signal is output from the PC (the /CE signal becomes LOW), the control signal from the operating signal detection circuit 12 is HIGH, and the /WAIT signal is delayed a known period by the delay circuit 22 and then becomes HIGH. Note that the delay time of the delay circuit 22 must be set to a period longer than the time required for the power supply control circuit to raise the output voltage from 3.3 V to 5 V.

The operation of the memory card 11 according to the present invention is described next.

When the memory card 11 is in the hold state, i.e., when not mounted in a PC, the 3-V current required to retain the stored data is supplied to the SRAM integrated circuit 14 by the internal power supply circuit 15.

When the memory card 11 is inactive, i.e., when mounted in a PC without being accessed, the /CE signal is inactive (HIGH), and the operating signal detection circuit 12 outputs a LOW control signal to the power supply control circuit 13. The power supply control circuit 13 supplies the 3.3-V refresh current to the SRAM integrated circuit 14 according to the control signal from the operating signal detection circuit 12. As a result, a 3.3-V power supply current is supplied to the memory card 11 when the memory card 11 is mounted in the PC but is inactive (not being accessed).

When the memory card 11 is active, i.e., when mounted in a PC and is being accessed, the /CE signal is active (LOW), and the operating signal detection circuit 12 outputs a HIGH control signal. The power supply control circuit 13 thus supplies the 5-V active current to the SRAM integrated circuit 14 according to the control signal from the operating signal detection circuit 12.

When the memory card 11 changes from an inactive state to an active state, a delay period is required for the power supply voltage to the SRAM to rise from 3.3 V and stabilize at 5 V. It is therefore necessary to delay the operation of the CPU in the data processing device (PC) in which the memory card 11 is mounted until the supply voltage stabilizes, even if the /CE signal is output. The power supply control circuit 13 of the memory card 11 therefore outputs a standby signal to the PC as a /WAIT signal causing the control signal from the operating signal detection circuit 12 to be delayed as shown in FIG. 5. This delays the timing at which CPU operation starts, and enables the memory card 11 to be accessed only after the power supply to the memory card 11 stabilizes.

Figures 7, 8:
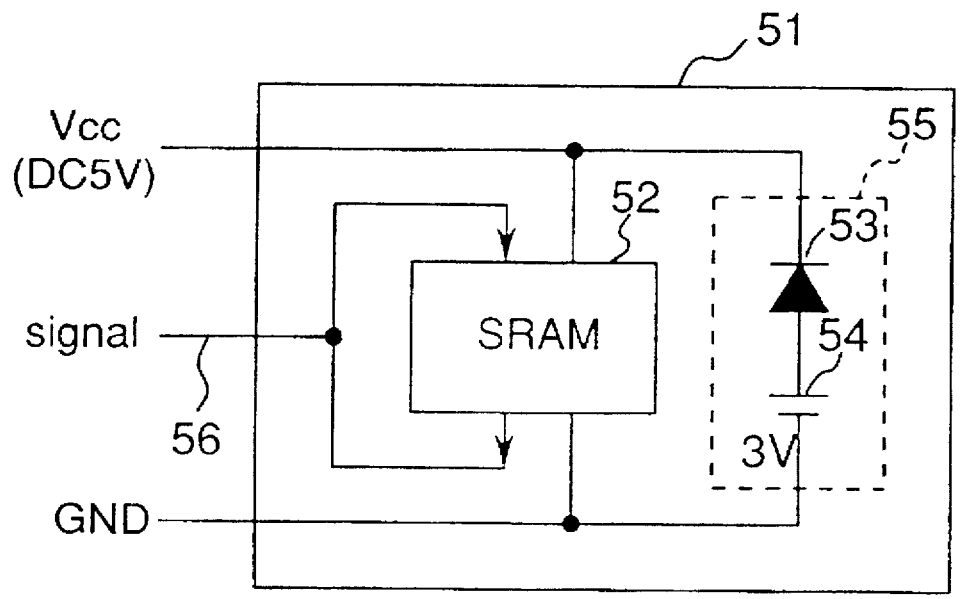
FIG. 7 is a circuit diagram of a prior art SRAM memory card.
FIG. 8 is a table showing the current consumption of an SRAM memory card according to the prior art during various operating states.

The current consumption of one integrated memory circuit in the SRAM memory card 11 of the present embodiment is shown in FIG. 6. As shown in FIG. 6, current consumption is greatly reduced compared with a prior art memory card (FIG. 8) because the voltage applied to the SRAM integrated circuit 14 when the memory card 11 is mounted in a PC and is inactive is low.

An SRAM memory card according to the present invention as described above thus detects the operating status of the memory card 11 when mounted in a PC using the operating signal detection circuit 12. Based on the control signal from the operating signal detection circuit 12, the power supply control circuit 13 then supplies to the SRAM integrated circuit 14 a 5-V current when the memory card 11 is active, and a 3.3-V current when the memory card 11 is inactive. Power consumption during inactive states is thus greatly reduced.

It should be noted that while the inactive state voltage supply to the SRAM integrated circuit 14 is 3.3 V in this embodiment, this voltage level is to block the voltage supply from the internal power supply circuit 15 in the inactive state. The inactive state voltage shall therefore not be limited to this value (3.3 V), and may be any voltage exceeding that supplied from the internal power supply circuit 15.

It should also be noted that while the present embodiment has been described with reference to an SRAM type memory card, the same effect can be obtained with other types of memory that reduce current consumption by operating at a lower voltage during inactive states than during active states. Specifically, the present invention can also be applied with memory cards using flash memory circuitry.

Effects of the Invention

A low power consumption memory card can be achieved with the present invention thus described because the voltage supplied to a memory card mounted in a data processing device is lower when the memory card is inactive than when the memory card is active.

In a memory card according to a preferred embodiment of the present invention, the operating signal detection circuit is a retriggerable single-shot multivibrator. It is therefore possible to detect from the operating control signal supplied from the PC whether the memory card is active or inactive.

In a memory card according to a preferred embodiment of the present invention, the power supply control circuit switches the output voltage based on the detection result from the operating signal detection circuit. When the memory card is changed from an inactive to an active state, the power supply control circuit outputs a standby signal to the data processing device to delay the start of data processing device operation until the voltage supply to the integrated memory circuit stabilizes. The data processing device is therefore able to access the memory normally after voltage stabilization.

A memory card according to a preferred embodiment of the present invention is able to achieve a low power consumption memory card by using as the integrated memory circuit thereof a memory device whereby power consumption can be reduced by reducing the power supply voltage, e.g., an SRAM device or flash memory device.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A memory card including an integrated memory circuit and internal power supply whereby a power supply voltage from a data processing device is supplied to the integrated memory circuit when said memory card is mounted in the data processing device, and another power supply voltage is supplied to the integrated memory circuit from the internal power supply when said memory card is not mounted in the data processing device, said memory card comprising:

an operating signal detection circuit for determining whether said memory card is active or inactive when mounted in the data processing device based on an operating control signal input thereto from the data processing device and outputting a control signal, and a power supply control circuit for switching the power supply voltage applied to the integrated memory circuit from the data processing device and the internal power supply depending on a state of the memory card and for receiving the control signal and controlling the power supply voltage applied to the integrated memory circuit such that the power supply voltage from the data processing device is applied to the integrated memory circuit when said memory card is active, and the power supply voltage from the data processing device is dropped by a predetermined amount before being applied to the integrated memory circuit when said memory card is inactive.

2. A memory card including an integrated memory circuit and internal power supply whereby a power supply voltage from a data processing device is supplied to the integrated memory circuit when said memory card is mounted in the data processing device, and another power supply voltage is supplied to the integrated memory circuit from the internal power supply when said memory card is not mounted in the data processing device, said memory card comprising:

an operating signal detection circuit for determining whether said memory card is active or inactive when mounted in the data processing device based on an operating control signal input thereto from the data processing device and outputting a control signal, and a power supply control circuit for receiving the control signal and for controlling the power supply voltage applied to the integrated memory circuit such that the power supply voltage from the data processing device is applied to the integrated memory circuit when said memory card is active, and the power supply voltage from the data processing device is dropped by a predetermined amount before being applied to the integrated memory circuit when said memory card is inactive;

wherein said operating signal detection circuit is a retriggerable single-shot multi-vibrator of which an input trigger is the operating control signal from the data processing device.

3. A memory card including an integrated memory circuit and internal power supply whereby a power supply voltage from a data processing device is supplied to the integrated memory circuit when said memory card is mounted in the data processing device, and another power supply voltage is supplied to the integrated memory circuit from the internal power supply when said memory card is not mounted in the data processing device, said memory card comprising:

an operating signal detection circuit for determining whether said memory card is active or inactive when mounted in the data processing device based on an operating control signal input thereto from the data processing device and outputting a control signal, and a power supply control circuit for receiving the control signal and for controlling the power supply voltage applied to the integrated memory circuit such that the power supply voltage from the data processing device is applied to the integrated memory circuit when said memory card is active, and the power supply voltage from the data processing device is dropped by a predetermined amount before being applied to the integrated memory circuit when said memory card is inactive;

wherein said power supply control circuit includes a DC-DC converter for applying the power supply voltage from the data processing device to the integrated memory circuit when said memory card is active, and dropping the power supply voltage by the predetermined amount and then applying a low power supply voltage from the data processing device to the integrated memory circuit when said memory card is inactive, and a standby signal output circuit for outputting a standby signal to temporarily pause data processing device operation when said memory card operation changes from the inactive to the active state.

4. The memory card of claim 1, wherein the integrated memory circuit is an SRAM circuit.

5. The memory card of claim 1, wherein the integrated memory circuit is a flash memory circuit.

6. A memory card comprising:

an operating signal detection circuit for determining whether said memory card is active or inactive when mounted in a data processing device based on an operating control signal input thereto from the data processing device and outputting a control signal, and a power supply control circuit for receiving the control signal and for controlling a power supply voltage applied to an integrated memory circuit of said memory card such that a power supply voltage from the data processing device is applied to the integrated memory circuit when said memory card is active, and the power supply voltage from the data processing device is dropped by a predetermined amount before being applied to the integrated memory circuit when said memory card is inactive, said power supply circuit including a standby signal output circuit for outputting a standby signal to temporarily pause data processing device operation when said memory card operation changes from the inactive to the active state.

7. The memory card of claim 6, wherein said operating signal detection circuit is a retriggerable single-shot multivibrator of which an input trigger is the operating control signal from the data processing device.

8. The memory card of claim 6, wherein the integrated memory circuit is an SRAM circuit.

9. The memory card of claim 6, wherein the integrated memory circuit is a flash memory circuit.

* * * * *